(12) United States Patent
Qu et al.

(10) Patent No.: US 9,748,230 B2
(45) Date of Patent: Aug. 29, 2017

(54) SEMICONDUCTOR APPARATUS HAVING A TRENCH SCHOTTKY BARRIER SCHOTTKY DIODE

(71) Applicant: Robert Bosch GmbH, Stuttgart (DE)

(72) Inventors: Ning Qu, Reutlingen (DE); Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/058,675

(22) Filed: Mar. 2, 2016

(65) Prior Publication Data

US 2016/0268449 A1 Sep. 15, 2016

(30) Foreign Application Priority Data

Mar. 9, 2015 (DE) .................... 10 2015 204 137

(51) Int. Cl.
| | |
|---|---|
| *H01L 29/04* | (2006.01) |
| *H01L 27/08* | (2006.01) |
| *H01L 29/872* | (2006.01) |
| *H01L 29/06* | (2006.01) |
| *H01L 29/47* | (2006.01) |
| *H01L 29/16* | (2006.01) |
| *H01L 29/20* | (2006.01) |

(52) U.S. Cl.
CPC ...... *H01L 27/0814* (2013.01); *H01L 29/0619* (2013.01); *H01L 29/0623* (2013.01); *H01L 29/872* (2013.01); *H01L 29/1608* (2013.01); *H01L 29/20* (2013.01); *H01L 29/47* (2013.01); *H01L 29/475* (2013.01)

(58) Field of Classification Search
CPC ... H01L 29/8725; H01L 29/36; H01L 29/861; H01L 27/0814; H01L 29/872; H01L 29/0623; H01L 29/0619; H01L 29/47; H01L 29/745; H01L 29/1608; H01L 29/20

USPC .... 257/54, 73.155, 260, 471, 449, 476, 473, 257/E33.051; 438/48, 570, 92, 167

See application file for complete search history.

(56) References Cited

U.S. PATENT DOCUMENTS

| | | | | |
|---|---|---|---|---|
| 6,426,541 | B2 * | 7/2002 | Chang | H01L 21/2815 257/472 |
| 2002/0008237 | A1 * | 1/2002 | Chang | H01L 21/2815 257/54 |
| 2004/0173801 | A1 * | 9/2004 | Willmeroth | H01L 29/0692 257/73 |
| 2007/0023781 | A1 * | 2/2007 | Mizukami | H01L 29/66136 257/192 |

(Continued)

FOREIGN PATENT DOCUMENTS

DE 102004059640 6/2006

*Primary Examiner* — Thinh T Nguyen
(74) *Attorney, Agent, or Firm* — Norton Rose Fulbright US LLP; Gerard Messina (57) ABSTRACT

A semiconductor apparatus having a trench Schottky barrier Schottky diode, which includes: a semiconductor volume of a first conductivity type, which semiconductor volume has a first side covered with a metal layer, and at least one trench extending in the first side and at least partly filled with metal. At least one wall segment of the trench, and/or at least one region, located next to the trench, of the first side covered with the metal layer, is separated by a layer, located between the metal layer and the semiconductor volume, made of a first semiconductor material of a second conductivity type.

21 Claims, 2 Drawing Sheets

(56) References Cited

U.S. PATENT DOCUMENTS

2007/0034901 A1* 2/2007 Lui .................. H01L 29/407
            257/197
2009/0032897 A1* 2/2009 Goerlach .......... H01L 29/66143
            257/476

* cited by examiner

SEMICONDUCTOR APPARATUS HAVING A TRENCH SCHOTTKY BARRIER SCHOTTKY DIODE

CROSS REFERENCE

The present application claims the benefit under 35 U.S.C. §119 of German Patent Application No. 102015204137.9 filed on Mar. 9, 2015, which is expressly incorporated herein by reference in its entirety.

BACKGROUND INFORMATION

The present invention relates to a semiconductor apparatus having a trench Schottky barrier Schottky diode. A semiconductor apparatus of this kind in the form of a trench Schottky barrier Schottky diode is described in German Patent Application No. DE 10 2004 059 640 A1, and has a semiconductor volume of a first conductivity type, which semiconductor volume has a first side covered with a metal layer, and at least one trench extending in the first side and at least partly filled with metal.

Schottky diodes usually have metal-semiconductor contacts or silicide-semiconductor contacts. In Schottky diodes, high injection does not occur in forward mode, and clearing of minority charge carriers at turn-off is therefore absent. They switch comparatively quickly and with little loss. The term "high injection" refers here to a state in which the density of injected minority charge carriers approaches the order of magnitude of the majority charge carriers.

Schottky diodes have relatively high leakage currents, however, especially at high temperature, with a strong voltage dependence due to the "barrier lowering" effect. Thick and lightly doped semiconductors are also generally needed for high reverse voltages, resulting in comparatively high forward voltages at high currents. Power Schottky diodes using silicon technology are therefore, despite good switching behavior, poorly suitable or unsuitable for reverse voltages above 100 V.

The semiconductor apparatus according to the present invention differs from the existing art, and is notable for at least the fact that at least one wall segment of the trench, and/or at least one region, located next to the trench, of the first side covered with the metal layer, has a layer, located between the metal layer and the semiconductor volume, made of a first semiconductor material of a second conductivity type.

The example trench Schottky barrier Schottky diode according to the present invention (hereinafter also referred to as a "TSBS-P" or "TSBS-PN-P" or "diode," as will be further explained below) makes possible a comparatively low forward voltage and comparatively low switching losses. The comparatively thin layer of the first semiconductor material of the second conductivity type furthermore enables additional shielding of a Schottky contact constituted by use of the metal layer. The result is that reverse currents can be appreciably reduced, in particular at high temperature, while forward voltages and switching losses remain comparatively low.

The layer, disposed in this fashion, made of the first semiconductor material enables particularly low forward voltages in the range of high current densities as compared with conventional high-voltage Schottky diodes, since the conductivity of the semiconductor volume is greatly elevated by high injection. This advantage can be further enhanced by way of an integrated PN diode. In addition, the layer, disposed in this fashion, made of the first semiconductor material results in comparatively low leakage currents thanks to shielding of the Schottky effect with the aid of the trench structure. This is furthermore suitable for modifications that yield comparatively good robustness thanks to a voltage-limiting clamping function of an integrated PN diode.

As compared with conventional high-voltage PiN diodes, the advantage of a comparatively low forward voltage at high current density is obtained with the aid of a suitable Schottky contact barrier height in combination with high injection at high current density. Comparatively low turn-off losses are also obtained, since in forward mode fewer charge carriers are injected into and stored in the low-doped region as a result of the Schottky contact system (e.g., Schottky contact in combination with a thin p-layer directly beneath the Schottky contact). As compared with further conventional "cool SBD" diodes, lower forward voltages at high current density occur thanks to more intense high injection, and lower leakage currents are obtained as a result of effective shielding of the Schottky effect.

As compared with a conventional TSBS or TSBS-PN not having a semiconductor layer disposed in this manner (located, for example, as a thin p-layer directly beneath the Schottky contact), particularly low leakage currents are obtained along with a lower forward voltage at high current density, with somewhat higher turn-off losses. In embodiments having an integrated PN diode, particularly low leakage currents are obtained with almost the same forward voltage at high current density, and almost identical turn-off losses.

Advantageous embodiments are described below and are shown in the figures. The features can be advantageous both in isolation and in various combinations even though further reference thereto is not explicitly made.

It is possible to embody the diode according to the present invention in such a way that a breakdown voltage of the diode is, for example, higher than 10 volts, in particular higher than 100 volts, in particular higher than 200 volts, or in particular even higher than 600 volts. The Schottky diode according to the present invention is thus suitable in particular for high-voltage utilization, and at the same time has a low forward voltage, a low leakage current, and low switching loss, and is highly robust. The Schottky diode according to the present invention can furthermore advantageously be used in particular as a power diode for inverters, for example for photovoltaics or automobile applications. For example, the diode can also be used as a so-called "freewheeling" diode.

In an embodiment of the semiconductor apparatus, the semiconductor volume has at least two trenches. The advantageous properties of the trench Schottky barrier Schottky diode can thereby be further improved.

Provision can furthermore be made that the first semiconductor material of the second conductivity type has a layer thickness in a range from 10 nm to 500 nm. Provision can moreover be made that a doping concentration of the first semiconductor material of the second conductivity type is in a range from $10^{16}$ atoms per cubic centimeter to $10^{17}$ atoms per cubic centimeter. Thin layers of this kind, in particular together with the doping concentration indicated, are particularly suitable for enabling a comparatively low reverse current, a comparatively low forward voltage, and comparatively low switching losses for the diode according to the present invention.

In an example embodiment of the present invention, a region of a bottom of the at least one trench is filled with a second semiconductor material, the second semiconductor material being a polycrystalline semiconductor material of a second conductivity type or a semiconductor material of the second conductivity type. This is preferably accomplished in such a way that a PN diode is formed by way of the second semiconductor material and the semiconductor volume of the first semiconductor type. It thereby becomes possible to integrate a PN diode (a so-called "clamping" element) into the semiconductor apparatus according to the present invention, electrically in parallel with the trench Schottky barrier Schottky diode.

In an embodiment of the invention, a breakdown voltage of the PN diode is lower than a breakdown voltage of the trench Schottky barrier Schottky diode constituted by the metal layer, by the layer of a first semiconductor material of the second conductivity type, and by the semiconductor volume of the first conductivity type.

Preferably, the semiconductor apparatus is embodied in such a way that an electrical breakdown can occur in a region of the bottom segment of the at least one trench.

Preferably, the semiconductor apparatus is embodied in such a way that it can be operated in a state of breakdown with comparatively high currents.

In an example embodiment of the present invention, the region of the bottom of the at least one trench is converted, by ion implantation of boron (generally: of dopant of a second conductivity type at a higher concentration than that of the first conductivity type), to a semiconductor material of the second conductivity type. The overall properties of the semiconductor apparatus can thereby be improved.

Provision can furthermore be made that the trench at least partly filled with metal has at least two metal plies disposed above one another with respect to a depth of the trench, an upper metal ply forming a segment of the metal layer with which the first side of the semiconductor volume of the first conductivity type is covered, and the metal plies preferably encompassing different metals. Preferably the at least one trench is completely filled with at least one metal.

Provision can be made in supplementary fashion that a height of a potential step (Schottky barrier) of the upper metal ply, which corresponds to the metal layer, is lower than a height of a potential step (Schottky barrier) of a metal ply disposed therebeneath. The result is to produce a plurality of further advantageous possibilities for improving the properties of the trench Schottky barrier Schottky diode and adapting them to particular electrical requirements.

In a further example embodiment of the semiconductor apparatus, a second side of the semiconductor volume, which is located oppositely facing away from the first side covered with the metal layer, is covered with an electrically conductive contact material, and a partial volume, adjacent to the contact material, of the semiconductor volume is more highly doped than the remaining semiconductor volume. The partial volume is, in particular, a so-called "$n^+$" substrate (with inverse doping of the semiconductor apparatus it is a "$p^+$" substrate), as is similar fashion in the related art. The metal layer described above can be used as a first electrode (anode electrode) and the aforesaid contact material (which preferably is likewise embodied as a metal layer) can be used as a second electrode (cathode electrode). The overall result is to describe a particularly suitable configuration for the diode according to the present invention.

In an example embodiment of the semiconductor apparatus according to the present invention, it has solderable electrodes or solderable component terminals.

In an example embodiment of the semiconductor apparatus, it is embodied as a press-in diode and has a corresponding housing. Provision can be made in supplementary fashion that the semiconductor apparatus is an element of a rectifier assemblage for a motor vehicle.

Provision can furthermore be made that the semiconductor apparatus is manufactured at least in part using an epitaxy method and/or using an etching method and/or using an ion implantation method. Advantageous possibilities for manufacturing the semiconductor apparatus according to the present invention are thereby described.

In a further embodiment of the semiconductor apparatus, a depth of the at least one trench is from 1 μm (micrometer) to 4 μm, preferably is approximately 2 μm. This configuration yields particularly suitable dimensions, for example, for use of the diode according to the present invention for a rectifier assemblage in motor vehicles. For example, an allowable reverse voltage of approximately 600 volts can be achieved for the diode according to the present invention. A further advantageous configuration of the semiconductor apparatus is obtained if a ratio of a depth of the trench to a clearance between each two trenches is greater than or equal to approximately 2.

Provision can furthermore be made that the at least one trench has substantially a ribbon shape and/or substantially an island shape. The ribbon shape describes a substantially elongated shape (line) and the island shape describes substantially a concentrated shape, in particular a circular shape, hexagonal shape, or the like. Preferably the trench has a substantially rectangular cross section. A bottom of the trench can be embodied to be flat or rounded ("U" shape), for example semi-spherical.

In a first variant of the semiconductor apparatus according to the present invention, the first conductivity type corresponds to an n-doped semiconductor material and the second conductivity type corresponds to a p-doped semiconductor material. In a second variant of the semiconductor apparatus according to the present invention, the first conductivity type corresponds to a p-doped semiconductor material and the second conductivity type corresponds to an n-doped semiconductor material. The semiconductor apparatus is thus suitable in principle for both possible polarities.

Provision can furthermore be made that the semiconductor apparatus encompasses a silicon material and/or a silicon carbide material and/or a silicon-germanium material and/or a gallium arsenide material. The invention is thus applicable to all usual semiconductor materials.

Exemplifying embodiments of the present invention are explained below with reference to the figures.

DETAILED DESCRIPTION OF EXAMPLE EMBODIMENTS

In all the Figures, the same reference characters are used for functionally equivalent elements and values even when embodiments are different. The following abbreviations, among others, are used in part in the description that follows:

"TSBS" characterizes a trench Schottky barrier Schottky diode comparable to the related art.

"TSBS-PN" characterizes a trench Schottky barrier Schottky diode having an integrated PN diode as a so-called "clamping" element, comparable to the related art.

"TSBS-P" characterizes a trench Schottky barrier Schottky diode according to the present invention, a layer ("thin p-layer") made of a first semiconductor material (semiconductor material 26) of a second conductivity type being disposed between a metal layer (metal layer 14) and a semiconductor volume (semiconductor volume 12).

"TSBS-PN-P" characterizes a trench Schottky barrier Schottky diode according to the present invention, an integrated PN diode that constitutes a clamping element being present as a supplement to the "TSBS-P" embodiment.

Figure 1:
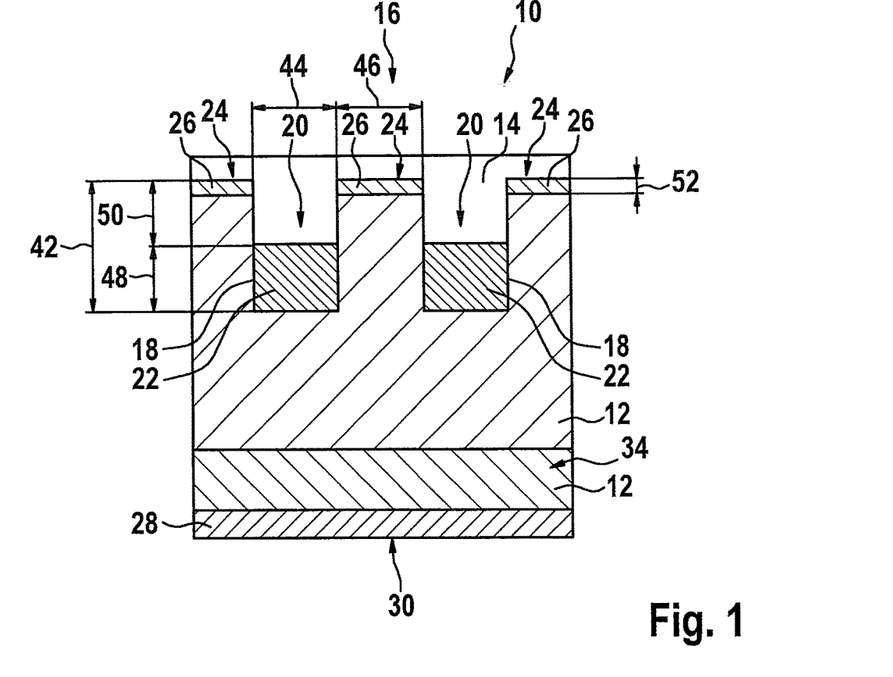
FIG. 1 is a simplified section view through a semiconductor apparatus of a first embodiment having a trench Schottky barrier Schottky diode.

FIG. 1 shows a first embodiment (TSBS-P) of a semiconductor apparatus 10 having a trench Schottky barrier Schottky diode, which has: a semiconductor volume 12 of a first conductivity type, which semiconductor volume 12 has a first side 16 covered with a metal layer 14 and, in the present case, two trenches 18 extending in first side 16 and at least partly filled with metal.

A depth 42 of trench 18 is respectively approximately 2 µm. In further embodiments of semiconductor apparatus 10, depth 42 of trench 18 can be between 1 µm and 4 µm. A ratio of depth 42 of trench 18 to a clearance 46 between each two trenches 18 is approximately 2. In further embodiments of semiconductor apparatus 10 this ratio can also be less than or greater than 2.

In the present case each of trenches 18 has metal plies 20 and 22 disposed one above another with reference to depth 42 (defined vertically in FIG. 1) of trench 18, an upper metal ply 20 forming a segment of metal layer 14 with which first side 16 of semiconductor volume 12 of the first conductivity type is covered. Preferably metal plies 20 and 22 encompass different metals. In the present case a height of a potential step (Schottky barrier) of upper metal ply 20, which in the present case corresponds to metal layer 14, is lower than a height of a potential step (Schottky barrier) of metal ply 22 located therebeneath. Further metal layers that constitute, for example, a solderable surface can be located (not shown) above upper metal layer 14.

As shown in FIG. 1, regions 24, located next to trench 18, of first side 16 covered with metal layer 14 are separated by a layer 26, located between metal layer 14 and semiconductor volume 12, made of a first semiconductor material of a second conductivity type. The aforesaid layer 26 made of the first semiconductor material is comparatively thin. In the present case layer 26 has a layer thickness of approximately 10 nm to approximately 500 nm. The layer thickness is, for example, approximately 70 nm. A doping concentration of the semiconductor material of the second conductivity type is approximately $10^{16}$ atoms per cubic centimeter to approximately $10^{17}$ atoms per cubic centimeter.

As is further shown, trenches 18 are completely filled with the metal of metal plies 20 and 22. Alternatively, trenches 18 can also not be completely filled with metal. All that is necessary is to ensure that wall surfaces of trenches 18 and a respective bottom 38 of trenches 18 are continuously contacted to the respective metal plies 20 and 22.

A second side 30 of semiconductor volume 12, which is oppositely located facing away from first side 16 covered with metal layer 14, is covered with an electrically conductive contact material 28. A partial volume 34, adjacent to contact material 28, of semiconductor volume 12 is more heavily doped than the remaining semiconductor volume 12. Preferably the electrically conductive contact material 28 is a metal. Contact material 28 can in turn encompass several metal layers located one above another.

Semiconductor apparatus 10 is manufactured at least in part using an epitaxy method and/or using an etching method and/or using an ion implantation method. Such methods for manufacturing semiconductor structures are conventional.

In an example embodiment of semiconductor apparatus 10, the aforesaid first conductivity type corresponds to an n-doped semiconductor material and the aforesaid second conductivity type corresponds to a p-doped semiconductor material. Metal layer 14 is part of a Schottky contact and in this case is an anode electrode. Contact material 28 correspondingly forms an associated cathode electrode.

In a further example embodiment of semiconductor apparatus 10, the first conductivity type corresponds to a p-doped semiconductor material and the second conductivity type corresponds to an n-doped semiconductor material.

In the present case, semiconductor apparatus 10 is manufactured substantially from a silicon material. In further embodiments, semiconductor apparatus 10 is manufactured from a silicon carbide material and/or a silicon-germanium material and/or a gallium arsenide material.

FIG. 1 furthermore shows several further dimensions on semiconductor 10 labeled with arrows or double arrows, in the form of a width 44 of trench 18, a thickness or a depth dimension 48 of the lower (in the drawing) metal ply 22, a thickness or a depth dimension 50 of upper metal ply 20, and a thickness or a depth dimension 52 of the layer made of first semiconductor material 26 of the second conductivity type.

Figure 2:
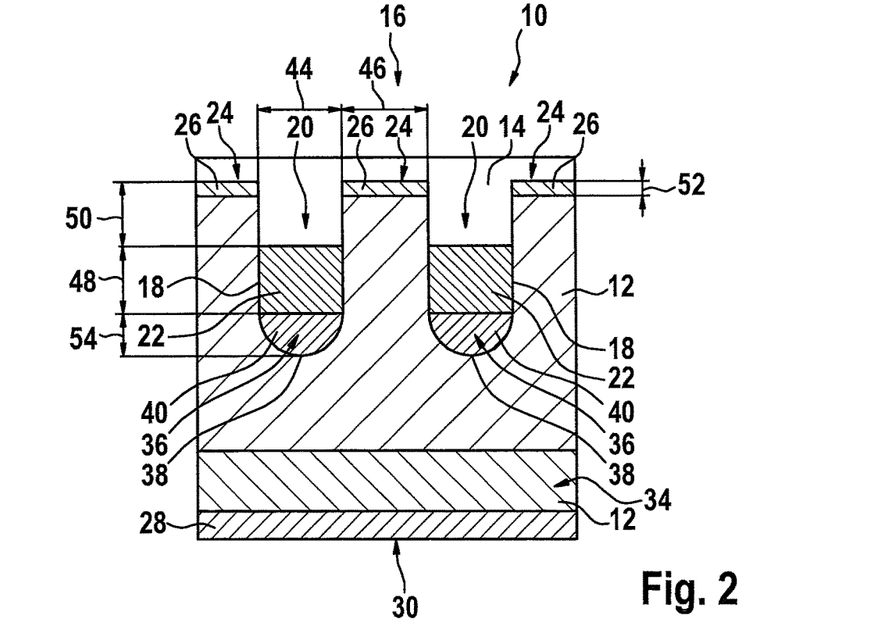
FIG. 2 is a simplified section view through a semiconductor apparatus of a second embodiment having a trench Schottky barrier Schottky diode and an integrated PN diode.

FIG. 2 shows a second embodiment (TSBS-PN-P) of semiconductor apparatus 10. Supplementing the embodiment of FIG. 1, in FIG. 2 a region 36 of a bottom 38 of trench 18 is filled with a second semiconductor material 40, second semiconductor material 40 being of the second conductivity type. Region 36 has a depth dimension 54 likewise identified by a double arrow.

Second semiconductor material 40 of the second conductivity type and semiconductor volume 12, disposed thereabove in the drawing, of the first conductivity type yield a PN diode. This PN diode is connected electrically in parallel with the trench Schottky barrier Schottky diode according to the present invention. In particular, a doping of semiconductor volume 12 is executed in such a way that upon operation of semiconductor apparatus 10 with high currents in a forward direction, high injection of charge carriers can occur.

Semiconductor apparatus 10 is configured in the present case, in terms of dimensions, material, and dopings, in such a way that a breakdown voltage of the PN diode is lower than a breakdown voltage of the trench Schottky barrier Schottky diode constituted by metal layer 14, by the layer made of first semiconductor material 26 of the second conductivity type, and by semiconductor volume 12 of the first conductivity type.

In an example embodiment of semiconductor apparatus 10, second semiconductor material 40 is a polycrystalline semiconductor material. In this case bottom 38 of trench 18 is converted from the first conductivity type to the second conductivity type by ion implantation, for example using the chemical element boron. This likewise results in a PN diode.

As FIG. 2 shows, the TSBS-PN-P is made up of an n⁺ substrate (partial volume 34), an n-epi layer (semiconductor volume 12), at least two trenches 18 etched into the n-epi layer, and a metal layer (electrically conductive contact material 28) on second side 30 ("back side") of the chip (semiconductor apparatus 10) as an ohmic contact or cathode electrode.

Lower region 36 of trenches 18 is filled with p-doped semiconductor material 40 (for example, p-silicon) or poly-semiconductor material (for example, polysilicon), in accordance with depth dimension 54 indicated in FIG. 2. Trenches 18 are then filled with a lower metal (metal ply 22) in accordance with depth dimension 48, with ohmic contact to the p-doped second semiconductor material 40 (in particular p-doped silicon or polysilicon) and with Schottky contact to semiconductor volume 12 (n-epi layer), and then covered with an upper metal (metal ply 20). The upper metal fills a portion of trenches 18 corresponding to depth dimension 50, with Schottky contact to the n-epi layer, and likewise serves (like the lower metal) as an anode electrode. In particular, the doping of the n-epi layer is selected so that upon operation with high currents in a forward direction, high injection into it exists.

As in the case of the TSBS-P (see FIG. 1), thin p-layers (first semiconductor material 26 of the second conductivity type) corresponding to an "Np" doping concentration are located directly beneath the Schottky contact (metal layer 14). Metal layer 14 forms, on first side 16 of semiconductor apparatus 10, not a single Schottky contact as in the case of the conventional TSBS-PN, but rather a "Schottky contact system" as is evident from FIG. 2.

An advantage of the TSBS-PN-P (FIG. 2) over the TSBS-P (FIG. 1) is the additional clamping function of the integrated PN diode, and robustness associated therewith. The voltage-limiting clamping function results from the fact that the breakdown voltage of the PN diode is lower than the breakdown voltage of the Schottky diode. This relative improvement (with PN/without PN) is similar to the result of a comparison of TSBS-PN with the conventional TSBS.

In the case of both the TSBS-P according to FIG. 1 and the TSBS-PN-P according to FIG. 2, regions 24 not only can be present on an "upper side" of semiconductor volume 12 but additionally (as will be shown below in the context of FIGS. 3 and 4) can also be disposed on respective wall segments 56 and/or on the respective bottom 38 of trenches 18.

Both TSBS-P (FIG. 1) and TSBS-PN-P (FIG. 2) can also have, in an edge region of semiconductor apparatus 10 according to the present invention, additional structures to reduce edge field strength. These can be, for example, lightly doped p-regions, field plates, or similar structures corresponding to the existing art.

In the interest of simplicity, it is assumed for the following description of functional aspects that the first conductivity type is a respective n-doping, and the second conductivity type is a respective p-doping. As already described above, the respective dopings can alternatively also be embodied conversely. This also applies to the exemplifying embodiment previously described with reference to the Figures.

As likewise explained in part above, an exemplifying embodiment of a diode according to the present invention encompasses an electrical contact material 28 (cathode electrode), built thereupon an n⁺ substrate as partial volume 34, built thereupon a n-epi layer (i.e. an epitaxially constructed semiconductor material) as an (in this case, intrinsic) semiconductor material supplementing partial volume 34 to yield semiconductor volume 12, preferably at least two trenches 18 implemented in the n-epi layer by etching, and a metal layer 14 constituting part of a Schottky contact or as an anode electrode on first side 16 of semiconductor apparatus 10. Upon manufacture, preferably trenches 18 are firstly filled up to a definable depth 48 with a first, lower (as depicted in FIG. 1) metal layer 22 (hereinafter also referred to as "first metal" or "lower metal") and are then covered with a second metal ply 20 (hereinafter also referred to as "second metal" or "upper metal"). Second metal ply 20 fills trenches 18 preferably up to an upper rim of trenches 18.

The first metal and the second metal are preferably selected so that the second metal possesses a lower barrier height than the first metal. In electrical terms, the TSBS is thus a combination of two Schottky diodes having different barrier heights: a first Schottky diode having a Schottky barrier between the first metal as anode and the n-epi layer as cathode, and a second Schottky diode having a Schottky barrier between the second metal as anode and the n-epi layer as cathode.

If the barrier heights of the two metals are considerably different, then upon operation in the flow direction ("forward direction"), currents flow principally to the upper metal having the lower barrier; the current also flows via the corresponding lateral wall segments of trenches 18. The effective area for current flow in the flow direction is therefore comparatively large in a TSBS.

In the reverse direction the first metal, with its greater barrier height, ensures a greater expansion of the space charge zones. The space charge zones expand with increasing voltage and, at a voltage that is lower than the breakdown voltage of the TSBS, collide with one another at the center of the region between two immediately adjacent trenches 18. The result is that the Schottky effects responsible for high reverse currents are shielded, and the reverse currents are reduced. This shielding effect is greatly dependent on structure parameters (e.g., depth 42 of trench 18), on clearance 46 between trenches 18, on width 44 of trench 18, and on a layer thickness of the first metal. The extent of the space charge zones in the so-called "mesa" region between trenches 18 is quasi-one-dimensional, as long as depth 42 of trenches 18 is appreciably greater than the aforesaid clearance 46.

The advantage of a TSBS is the combination of the two metals, which enables a certain separation of the designs in terms of requirements relating to forward voltage and shielding behavior. The forward voltage and the initial value of the reverse current are influenced predominantly by the second metal (which has a comparatively low barrier). The greater a layer thickness of the second metal, the lower the forward voltage and the higher the initial value of the reverse current. On the other hand, the first metal (which has a comparatively high barrier) determines the voltage dependence of the reverse current as well as the breakdown voltage and the current distribution at high reverse currents. The TSBS therefore offers an opportunity for optimization by combining the two metals. Both the respective layer thicknesses and the barrier heights of the two metals can be predefined as parameters.

The diode embodied in this fashion can be improved if (as already described above) a PN diode that acts electrically in parallel with the Schottky diode is integrated into semiconductor apparatus 10. In particular, so-called "hole injection" can take place. This diode is initially referred to below as a "TSBS-PN."

The TSBS-PN likewise encompasses the n+ substrate, the n-epi layer, at least two trenches 18 etched into the n-epi layer, and an electrically conductive contact material 28 on a second side 30 (as depicted, the lower side or back side) of semiconductor apparatus 10, producing an ohmic contact or the cathode electrode. A lower region of trenches 18 is filled with p-doped silicon or a polysilicon up to a first height (depth dimension 54). Trenches 18 are then filled with a first metal having a respective layer thickness, the first metal having an ohmic contact to the p-doped silicon or the polysilicon. The first metal also forms a Schottky contact to the n-epi layer and is thus at the same time part of the anode electrode. The first metal is furthermore covered with the second metal. The second metal fills trenches 18 preferably at least up to the upper rim of trenches 18. In addition, the second metal likewise forms, in regions of first side 16 adjacent to trenches 18, a Schottky contact to the n-epi layer, and likewise serves as part of the anode electrode.

In electrical terms, the TSBS-PN that is depicted is a combination of two Schottky diodes having different barrier heights and a PN diode having "p-troughs" disposed on bottom 38 of trenches 18 as an anode, and the n-epi layer as a cathode. In particular, the doping of the n-epi layer is selected so that upon operation with high currents in the forward direction, high injection of charge carriers into it can occur.

In the TSBS-PN (comparably to the TSBS with no PN diode) currents flow in the forward direction at first, i.e. at an initially comparatively low voltage in the flow direction, only through the Schottky diode of upper metal ply 20. As currents rise, forward currents also flow increasingly through the PN transition, and optionally also through the Schottky diode of lower metal ply 22 (depending on the respective barrier height).

The TSBS-PN thus has a trench structure with a Schottky diode and PN diode connected in parallel. This combination ensures that in forward operation the charge carrier concentration in the lightly doped region is much higher than in a Schottky diode but considerably lower than, for example, in a PiN diode. An optimization is thus achieved between forward voltage on the one hand, and switching losses on the other hand.

In the reverse direction, space charge zones form both at the Schottky barriers and at the PN transition. This shielding effect is greatly dependent on structural parameters, in particular clearance 46 between trenches 18, width 44 of trench 18 or the width of the aforesaid p-trough, a respective proportional layer thickness of the p-doped silicon or polysilicon (corresponding to a layer thickness of the p-trough), and the layer thickness of the first metal.

The TSBS-PN additionally offers comparatively good robustness thanks to the integrated "clamping" function of the PN diode. The breakdown voltage (BV_pn) of the PN diode is designed so that BV_pn is lower than the breakdown voltage (BV schottky) of the Schottky diodes. The breakdown preferably takes place at the bottom of the trench, and the breakdown voltage of a TSBS-PN is determined by BV_pn. A high field strength therefore does not exist in the vicinity of the Schottky contacts, and in breakdown mode the reverse currents then flow only through the PN transition and not through the Schottky contacts as in a TSBS. The robustness of the TSBS-PN is thus comparable to that of a PN diode. The TSBS-PN is therefore also suitable, for example, as a Zener diode, although the character of a Schottky diode is nevertheless partly retained, as with a TSBS. A leakage current of the TSBS-PN, in particular at high temperature, is considerably higher as compared with a PN diode.

A substantial improvement in the trench Schottky barrier Schottky diode is obtained according to the present invention (as already described above) by the fact that at least one wall segment 56 (see FIGS. 3 and 4) of trench 18, and/or at least one region 24, located next to trench 18, of first side 16 covered with metal 14, is separated by the layer, located between metal layer 14 and semiconductor volume 12 in region 24, made of first semiconductor material 26 of the second conductivity type ("TSBS-P" or "TSBS-PN-P"). This can result, compared, e.g., with conventional PiN power diodes, in considerably lower switching losses with comparatively low forward voltages and, compared with a TSBS or TSBS-PN, in considerably lower reverse currents with comparable forward voltages and switching losses.

The comparatively thin p-layer made of first semiconductor material 26 of the second conductivity type (for example having an "Np" doping concentration), directly beneath the (topmost) metal layer 14 that constitutes a Schottky contact, furthermore provides additional shielding of the Schottky contact. The result is that reverse currents can be considerably reduced, in particular at high temperature, while the forward voltage and switching losses remain comparatively low. Because of the thin p-layer the trench Schottky barrier Schottky diode according to the present invention constitutes overall not just a single Schottky contact but rather a "Schottky contact system."

Note: In the present case the "thin p-layer" is spoken of generally in the singular in order to indicate that in a respective current path, current passes only through exactly one such thin p-layer. It is understood here that in particular because of trenches 18, semiconductor apparatus 10 according to the present invention preferably has several such (parallel) thin p-layers that are therefore separated from one another by trench or trenches 18.

Example 1

If the aforesaid thin p-layer made of first semiconductor material 26 of the second conductivity type is comparatively thick and comparatively heavily doped, the Schottky contact is then almost completely shielded. Upper metal layer 14 on first side 16 (the "front side") of semiconductor apparatus 10 according to the present invention constitutes, with the thin p-layer, an ohmic contact. A resulting sequence of layers disposed on one another, namely upper metal layer 14, the thin p-layer (semiconductor material 26), the n-epi layer, and the n+ substrate, functions similarly to a PiN diode. Comparatively low reverse currents do result in this example, but also comparatively high forward voltages at low current density, and comparatively high switching losses.

Example 2

If, however, the thin p-layer is configured to be thin and is sufficiently lightly doped, the thin p-layer is then almost completely transparent for the Schottky contact.

Metal layer 14 on first side 16 (the "front side") of semiconductor apparatus 10, having the layer sequence: metal layer 14/thin p-layer (semiconductor material 26)/n-epi layer (semiconductor volume 12), forms a Schottky contact. The layer sequence: metal layer 14/thin p-layer (semiconductor material 26)/n-epi layer (semiconductor volume 12)/n+ substrate (partial volume 34) then functions comparably to a Schottky diode, yielding comparatively high reverse currents, comparatively high forward voltages at high current density, and comparatively low switching losses.

In the present case the thin p-layer is referred to as "transparent" when it is transparent to minority charge carriers, in the present case of a p-emitter for electrons. For this, on the one hand the barrier of this Schottky contact system (including the thin p-layer), determined by the doping concentration and the thickness (depth dimension 52) of the thin p-layer, must be low and thin enough that electrons can be injected from the Schottky contact into semiconductor material 26 or into semiconductor volume 12 (for example, silicon). On the other hand there should be very little recombination of the minority charge carriers (electrons) on their path through the thin p-layer; in other words, a transit time of the electrons must be very much shorter than their minority carrier lifetime.

Example 3

If the thickness and the doping concentration of the thin p-layer are designed suitably (in accordance with the invention), important parameters such as the forward voltages at high current density, reverse currents, and switching losses can be predefined or optimized. In this case, the layer sequence: metal layer 14/thin p-layer (semiconductor material 26)/n-epi layer (semiconductor volume 12)/n$^+$ substrate (partial volume 34) functions like a Schottky diode having a partly transparent p-layer. The optimization parameters for the p-layer are its layer thickness (depth dimension 54) and its "Np" doping concentration.

The present invention makes possible in particular a considerable reduction in reverse currents, in particular at high temperature, by generating the thin p-layer directly beneath the Schottky contact, with no concurrent perceptible effects on forward voltage and switching losses. This means on the one hand that the p-layer should preferably be sufficiently thin, and sufficiently lightly doped, that no (or very little) hole injection from the p-layer occurs in forward operation, and the charge carrier distribution thus corresponds substantially to that of the TSBS. On the other hand, it means that the thin p-layer should be comparatively thick and comparatively heavily doped in order to at least partly shield the Schottky contact in the reverse direction. As already described above, the p-layer is therefore embodied with a thickness in the range of 10 nm to 500 nm and a doping concentration in the range of $10^{16}$ to $10^{17}$ per cubic centimeter of volume, depending on the application requirements.

As also described above, the present invention also encompasses a TSBS-PN diode that, because of the thin p-layer according to the present invention, is referred to hereinafter as a "TSBS-PN-P" (trench Schottky barrier Schottky diode having an integrated PN diode as a clamping element, having a thin p-layer directly beneath the Schottky contact).

What results for the "TSBS-PN-P" diode, comparably to the "TSBS-P" diode described above, is also that the comparatively thin p-layer made of first semiconductor material 26 of the second conductivity type (for example, having an "Np" doping concentration) is disposed directly beneath the (topmost) metal layer 14 that forms a Schottky contact. Because of the thin p-layer the TSBS-PN-P diode according to the present invention correspondingly also constitutes not just a single Schottky contact but rather a "Schottky contact system."

To summarize, advantages of the present invention include, for example:

As compared with conventional high-voltage Schottky diodes:
  Particularly low forward voltages in the range of high current densities are possible, since the conductivity of the lightly doped region is greatly elevated by high injection. In the "TSBS-P" embodiment this results from the thin p-layer directly beneath the Schottky contact. In the "TSBS-PN-P" embodiment it results additionally from the integrated PN diode.
  Comparatively low leakage currents thanks to shielding of the Schottky effect with the aid of the trench structure in combination with the thin p-layer directly beneath the Schottky contact. The "TSBS-PN-P" embodiment is moreover comparatively robust as a result of the clamping function of the PN diode.

As compared with conventional high-voltage PiN diodes:
  Comparatively low forward voltage up to high current density, with the aid of a suitable Schottky contact barrier height in combination with high injection at high current density.
  Comparatively low turn-off losses, since in forward operation fewer charge carriers are injected into and stored in the lightly doped region as a result of the Schottky contact system (Schottky contact in combination with a thin p-layer directly beneath the Schottky contact).

As compared with a further solution (so-called "cool SBD" diodes) from the related art:
  Lower forward voltage at high current density thanks to greater high injection. Lower leakage currents as a result of effective shielding of the Schottky effect.

As compared with conventional TSBSs or TSBS-PNs not having a thin p-layer directly beneath the Schottky contact:
  The TSBS-P embodiment enables particularly low leakage currents as well as a lower forward voltage at high current density, with slightly higher turn-off losses.
  The TSBS-PN-P embodiment enables particularly low leakage currents with almost identical forward voltage at high current density and almost identical turn-off losses.

Figure 3:
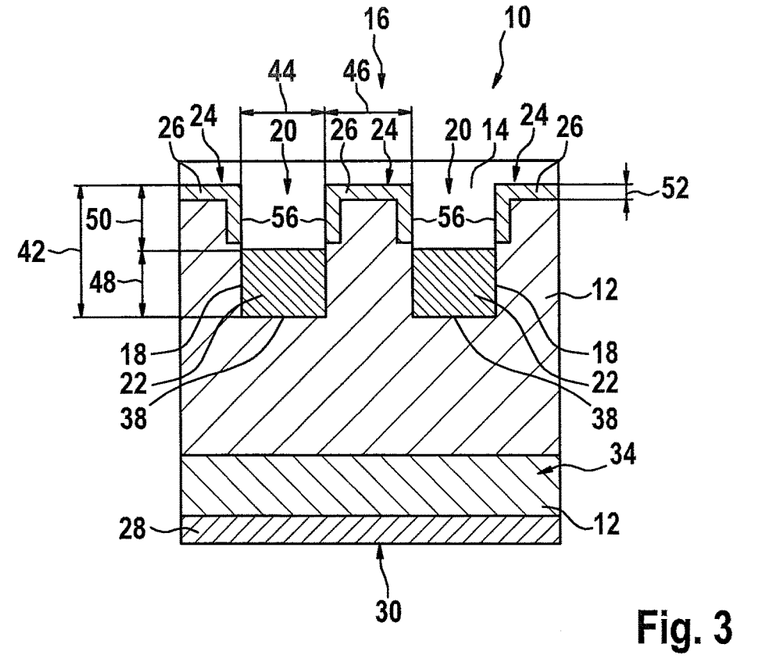
FIG. 3 is a simplified section view through a semiconductor apparatus of a third embodiment having a trench Schottky barrier Schottky diode.
Figure 4:
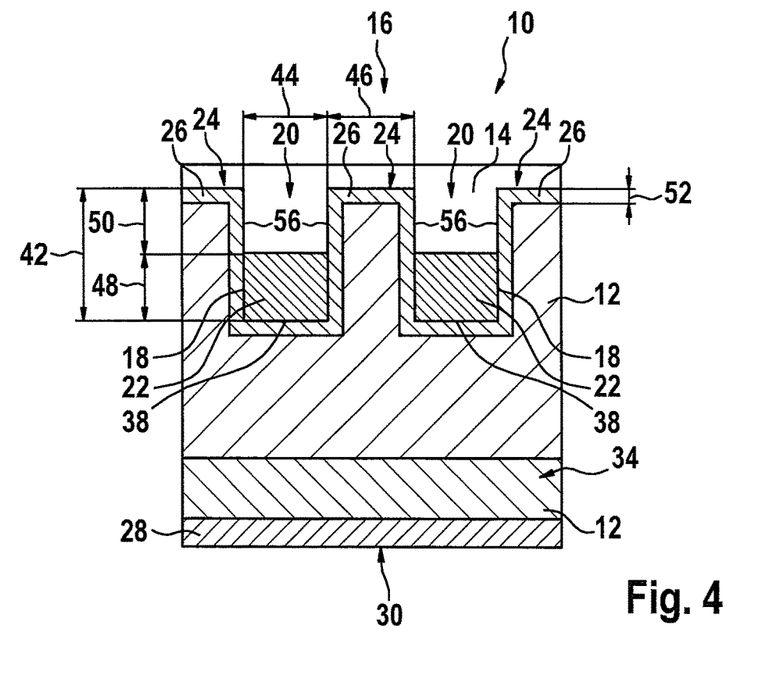
FIG. 4 is a simplified section view through a semiconductor apparatus of a fourth embodiment having a trench Schottky barrier Schottky diode.

FIG. 3 and FIG. 4 show further exemplifying embodiments of semiconductor apparatus 10 according to the present invention. In contrast to the embodiment according to FIG. 1, in the embodiment of FIG. 3 the (comparatively thin) first semiconductor material 26 of the second semiconductor type is additionally disposed at least locally on at least one wall segment 56 of trenches 18 up to a predefined depth (no reference character).

In the example embodiment of FIG. 4, first semiconductor material 26 is additionally disposed on a respective entire wall surface of trenches 18 and on bottom 38 of trenches 18. In FIG. 4 metal layer 14 or metal plies 20 and 22 are therefore each immediately adjacent to first semiconductor material 26, but not immediately adjacent to semiconductor volume 12.

What is claimed is:
1. A semiconductor apparatus having a trench Schottky barrier Schottky diode, comprising:
  a metal layer;
  a semiconductor volume of a first conductivity type, the semiconductor volume having a first side covered with the metal layer, and at least one trench extending in the first side and at least partly filled with metal; and
  a layer that:

is arranged between the metal layer and the semiconductor volume;
is made of a first semiconductor material of a second conductivity type;
is provided at least one of:
(i) at at least one wall segment of the trench; and
(ii) at at least one region of the first side covered with the metal layer,
which at least one region is next to the trench; and
has at least one of:
a layer thickness of approximately 10 nm (nanometers) to approximately 500 nm; and
a doping concentration of the first semiconductor material of the second conductivity type of approximately $10^{16}$ atoms per cubic centimeter of volume to approximately $10^{17}$ atoms per cubic centimeter of volume.

2. The semiconductor apparatus as recited in claim 1, wherein the semiconductor volume has at least two trenches.

3. The semiconductor apparatus as recited in claim 1, wherein the layer of the first semiconductor material of the second conductivity type has the layer thickness of approximately 10 nm to approximately 500 nm.

4. The semiconductor apparatus as recited in claim 1, wherein the doping concentration of the first semiconductor material of the second conductivity type is the approximately $10^{16}$ atoms per cubic centimeter of volume to approximately $10^{17}$ atoms per cubic centimeter of volume.

5. The semiconductor apparatus as recited in claim 1, wherein a region of a bottom of the at least one trench is filled with a second semiconductor material, the second semiconductor material being one of: i) a polycrystalline semiconductor material, or ii) a semiconductor material of the second conductivity type.

6. The semiconductor apparatus as recited in claim 1, wherein the trench at least partly filled with metal has at least two metal plies disposed above one another with respect to a depth of the trench, an upper one of the metal plies forming a segment of the metal layer with which the first side of the semiconductor volume of the first conductivity type is covered, and the metal plies encompass different metals.

7. The semiconductor apparatus as recited in claim 1, wherein the at least one trench is completely filled with at least one metal.

8. The semiconductor apparatus as recited in claim 1, wherein a second side of the semiconductor volume, which is located oppositely facing away from the first side covered with the metal layer, is covered with an electrically conductive contact material, and a partial volume, adjacent to the contact material, of the semiconductor volume being more highly doped than the remaining semiconductor volume.

9. The semiconductor apparatus as recited in claim 1, wherein the semiconductor apparatus is manufactured at least in part using at least one of an epitaxy method, an etching method, and an ion implantation method.

10. The semiconductor apparatus as recited in claim 6, wherein a height of a potential step or Schottky barrier of the upper metal ply, which corresponds to the metal layer, being lower than a height of a potential step or Schottky barrier of the metal ply disposed therebeneath.

11. The semiconductor apparatus as recited in claim 1, wherein a depth of the at least one trench being from 1 μm to 4 μm.

12. The semiconductor apparatus as recited in claim 11, wherein the depth of the at least one trench is approximately 2 μm.

13. The semiconductor apparatus as recited in claim 1, wherein a ratio of a depth of the trench to a clearance between each two trenches being greater than or equal to approximately 2.

14. The semiconductor apparatus as recited in claim 1, wherein the first conductivity type corresponds to an n-doped semiconductor material and the second conductivity type corresponds to a p-doped semiconductor material.

15. The semiconductor apparatus as recited in claim 1, wherein the first conductivity type corresponds to a p-doped semiconductor material and the second conductivity type corresponds to an n-doped semiconductor material.

16. The semiconductor apparatus as recited in claim 1, wherein the semiconductor apparatus encompasses at least one of a silicon material, a silicon carbide material, a silicon-germanium material, and a gallium arsenide material.

17. The semiconductor apparatus as recited in claim 1, wherein the layer thickness of the layer made of the first semiconductor material of the second conductivity type is 70 nm.

18. The semiconductor apparatus as recited in claim 1, wherein the layer made of the first semiconductor material of the second conductivity type is arranged below the metal layer and on top of a face of the semiconductor volume in which there is a respective hole forming an entrance into a respective one of the at least one trench.

19. The semiconductor apparatus as recited in claim 1, wherein the at least one trench includes at least two trenches, and for each of at least one pair of adjacent ones of the at least two trenches, the layer made of the first semiconductor material of the second conductivity type extends from an edge of one of the pair of trenches to an edge of another of the pair of trenches.

20. The semiconductor apparatus as recited in claim 1, wherein, below the metal in the trench, the trench further includes therein a second semiconductor material of the second conductivity type.

21. The semiconductor apparatus as recited in claim 6, wherein each of the metal plies extends across an entire width of the trench.

* * * * *